United States Patent
Lenhert et al.

(10) Patent No.: US 8,227,033 B2
(45) Date of Patent: Jul. 24, 2012

(54) METHOD OF APPLYING MEMBRANE LIPIDS TO A SUBSTRATE

(75) Inventors: Steven Lenhert, Karlsruhe (DE); Harald Fuchs, Nottuln (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 347 days.

(21) Appl. No.: 11/779,351

(22) Filed: Jul. 18, 2007

(65) Prior Publication Data
US 2008/0020141 A1    Jan. 24, 2008

(30) Foreign Application Priority Data
Jul. 19, 2006 (DE) .......... 10 2006 033 332

(51) Int. Cl.
*B05D 5/00* (2006.01)
*B05D 1/28* (2006.01)

(52) U.S. Cl. ........ 427/256; 977/713; 977/783; 977/849; 977/855; 977/857; 977/883

(58) Field of Classification Search .......... 427/287, 427/256; 977/713, 783, 849, 855, 857, 883
See application file for complete search history.

(56) References Cited

U.S. PATENT DOCUMENTS

| | | | |
|---|---|---|---|
| 6,479,288 B1 * | 11/2002 | Laffafian et al. ........... 435/455 |
| 6,756,078 B2 | 6/2004 | Bookbinder et al. | |
| 2002/0009807 A1 | 1/2002 | Kam et al. | |
| 2002/0122873 A1 | 9/2002 | Mirkin et al. | |
| 2003/0049381 A1 * | 3/2003 | Mirkin et al. ............... 427/402 |
| 2003/0138853 A1 * | 7/2003 | Lahiri et al. ................ 435/7.1 |
| 2005/0035983 A1 * | 2/2005 | Cruchon-Dupeyrat et al. .......... 346/140.1 |
| 2005/0090641 A1 * | 4/2005 | Valluzzi et al. ............. 530/350 |
| 2006/0242740 A1 | 10/2006 | Collier et al. | |

FOREIGN PATENT DOCUMENTS

| | | |
|---|---|---|
| KR | 20040094982 A | 11/2004 |
| WO | 00/41213 A1 | 7/2000 |
| WO | 02/45215 | 6/2002 |
| WO | 03/038033 | 5/2003 |

OTHER PUBLICATIONS

Discher et al., "Polymer vesicles" Aug. 9, 2002 Science, vol. 297, pp. 967-972.*
Piner et al., "'Dip-Pen' Nanolithography," Science 283, 661 (1999).*

(Continued)

*Primary Examiner* — William Phillip Fletcher, III
(74) *Attorney, Agent, or Firm* — Leydig, Voit & Mayer, Ltd.

(57) ABSTRACT

A method for applying membrane lipids to a substrate includes providing a substrate and an ink reservoir having an ink including a membrane lipid. The tip of a scanning probe microscope is dipped into the ink so as to dispose the membrane lipid on the tip. The tip of the scanning probe microscope is brought into contact with a surface of the substrate. The tip is moved over regions of the surface so that the membrane lipid migrates from the tip of the scanning probe microscope onto the surface of the substrate in the regions and the membrane lipid organizes itself in the regions in a form of a single lipid layer or in a form of one or a plurality of mutually superposed lipid bilayers. The tip is removed from the surface of the substrate.

13 Claims, 2 Drawing Sheets

OTHER PUBLICATIONS

Sheehan et al., "Thiol Diffusion and the Role of Humidity in 'Dip Pen Nanolithography'," Physical Review Letters, vol. 88, No. 15, Apr. 15, 2002, pp. 156104-1 to 156104-4.*

Moraille et al., "Nanoscale Stripe Patterns in Phospholipid Bilayers Formed by the Lagmuir-Blodgett Technique ," Langmuir 2003, 19, pp. 8041-8049.*

Nissen et al., "Interface Dynamics of Lipid Membrane Spreading on Solid Surfaces," Physical Review Letters, vol. 86, No. 9, Feb. 26, 2001, pp. 1904-1907.*

Carlson, J.W., Bayburt, T. and Sligar, S.G., "Nanopatterning Phospholipid Bilayers", University of Illiniois, Langmuir 2000, 16, pp. 3927-3931, published on Web Mar. 17, 2000.

Tristram-Nagle, S., Petrache, H.I., and Nagle, J.F., "Structure and Interactions of Fully Hydrated Dioleoylphosphatidylcholine Bilayers", Carnegie Mellon University, Pittsburgh, Pennsylvannia Biophysical Journal vol. 75, pp. 917-925, Aug. 1998.

Schuy, S. and Janshoff, A., "Thermal Expansion of Microstructured DMPC Bilayers Quantified by Temperature controlled Atomic Force Microspcopy", ChemPhysChem 2006, 7, pp. 1207-1210, 2006, Wiley-VCH Publishing, Weinheim.

Ginger, D.S., Zjang, H., and Mirkin, C.A.: "Zur Entwicklung der Dip-Pen-Nanolithographie", Angewandte Chemi, Agnew. Chem. 2004,116, pp. 30-46, 2004 Wiley-VCH Publishing, Weinheim.

Moraille et al. "Nanoscale Stripe Patterns in Phospholipid Bilayers Formed by the Langmuir-Boldgett Technique", Langmuir 2003, 19, pp. 8041-8049.

Nissen et al. "Interface Dynamics of Lipid Membrane Spreading on Solid Surfaces", Physical Review Letters, vol. 86, No. 9, Feb. 26, 2001, pp. 1904-1907, XP002492491.

Su et al. "Colored Ink dip-pen nanolithography", Applied Physics Letters, vol. 80, No. 23, Jun. 10, 2002, pp. 4434-4436.

European Search Report mailed Aug. 19, 2008 which issued during the prosecution of corresponding European Patent Application No. 07012255.

* cited by examiner

METHOD OF APPLYING MEMBRANE LIPIDS TO A SUBSTRATE

Priority is claimed to German patent application DE 10 2006 033 332.2, filed Jul. 19, 2006, which is hereby incorporated by reference herein.

The present invention relates to a method for applying membrane lipids to a substrate.

BACKGROUND

Membrane lipids are amphipathic molecules (amphiphilic molecules), i.e., they have a hydrophilic portion (polar head region) and a hydrophobic portion (long hydrocarbon chains). Three main groups of membrane lipids are known, i.e., phospholipids, glycolipids and cholesterin, as well as the subgroup ether lipids, which has branched chains.

Phospholipids are composed of four chemical components: fatty acids, a chemical platform that the fatty acids are bound to, a phosphate group, and an alcohol bound as an ester to the phosphate group. The chemical platform is either glycerin or sphingosine amino alcohol. The fatty acids vary in length, degree of saturation and degree of branching of their hydrocarbon chain.

U.S. Patent Application Publication 2002/0122873 A1 describes dip pen nanolithography (DPN) as a lithographic method for producing structures having dimensions of 10-1000 nm using a scanning probe microscope (atomic force microscope, AFM). In this connection, the tip of the scanning probe microscope is coated with the so-called ink, which is transferred by a driving force to the surface of a substrate. The macroscopic equivalent of DPN is writing with pen and ink, in this case, however, the pen having a nanoscale radius of curvature. The air humidity causes a liquid meniscus to form between the tip and the surface of a substrate which is then used to transfer the molecules from the tip to the surface. There, these molecules are chemically absorbed or patterned onto suitably prepared surfaces. Chemical, electrical, or magnetic forces are used as driving forces to apply molecules, clusters or nanocrystals to the substrate. Using this known method, it has so far only been possible to adjust the lateral dimensions of the structures applied to the surface.

In U.S. Pat. No. 6,756,078 B2, a method is described for applying phospholipids to a substrate, where the substrate, which is coated with a monolayer of a thioalkyl as a reactive substance, is first contacted by a linker compound, causing the linker compound to bind with the reactive substance to form a derivatized monolayer. It is only to this derivatized monolayer that the phospholipids are subsequently applied, and they chemically combine with the linker compound. The requisite covalent chemical bond between the phospholipids and the substrate is disadvantageous insofar as it limits the lateral mobility within the lipid bilayer.

U.S. Patent Application Publication 2002/0009807 A1 describes a method for applying phospholipids to regions of a substrate that have been provided with a film that promotes the deposition of lipid bilayers. In this connection, an aqueous phase, which contains the phospholipids, is applied to the substrate.

J. W. Carlson, T. Bayburt and S. G. Sligar, *Nanopatterning Phospholipid Bilayers*, Langmuir 2000, 16, 3927-3931, describes a method is known for patterning phospholipids on a substrate, regions of the layer of phospholipids on the surface of the substrate being removed by the tip of a scanning probe microscope. In the process, care must be taken to ensure that the layer of phospholipids does not dry out.

From S. Tristram-Nagle, H. I. Petrache and J. F. Nagle, *Structure and Interactions of Fully Hydrated Dioleoylphosphatidylcholine Bilayers*, Biophys. J. 75, 917-925 (1998), and S. Schuy and A. Janshoff, *Thermal Expansion of Microstructured DMPC Bilayers Quantified by Temperature Controlled Atomic Force Microscopy*, Chembiochem 7, 1207-1210 (2006), it is known that, at 20° C., 1,2-dioleoyl-sn-glycero-3-phosphocholin (DOPC) exists in a liquid-crystalline phase and that the thickness of a lipid bilayer is 3.4 to 3.5 nm, the precise value being dependent on the temperature, the air pressure and the air humidity.

SUMMARY

Against this background, it is an aspect of the present invention to provide a method for applying membrane lipids to a substrate that will overcome at least some of the aforementioned disadvantages and limitations.

The present invention provides a method for applying membrane lipids to a substrate. The method includes the steps of:

a) providing a substrate and an ink reservoir having an ink including a membrane lipid;

b) dipping a tip of a scanning probe microscope into the ink so as to dispose the membrane lipid on the tip;

c) bringing the tip of the scanning probe microscope into contact with a surface of the substrate and moving the tip over regions of the surface so that the membrane lipid migrates from the tip of the scanning probe microscope onto the surface of the substrate in the regions and the membrane lipid organizes itself in the regions in a form of a single lipid layer or in a form of one or a plurality of mutually superposed lipid bilayers; and d) removing the tip from the surface of the substrate.

BRIEF DESCRIPTION OF THE DRAWINGS

The present invention is explained in greater detail in the following with reference to exemplary embodiments. Specifically, the figures show.

DETAILED DESCRIPTION

Figure 1:
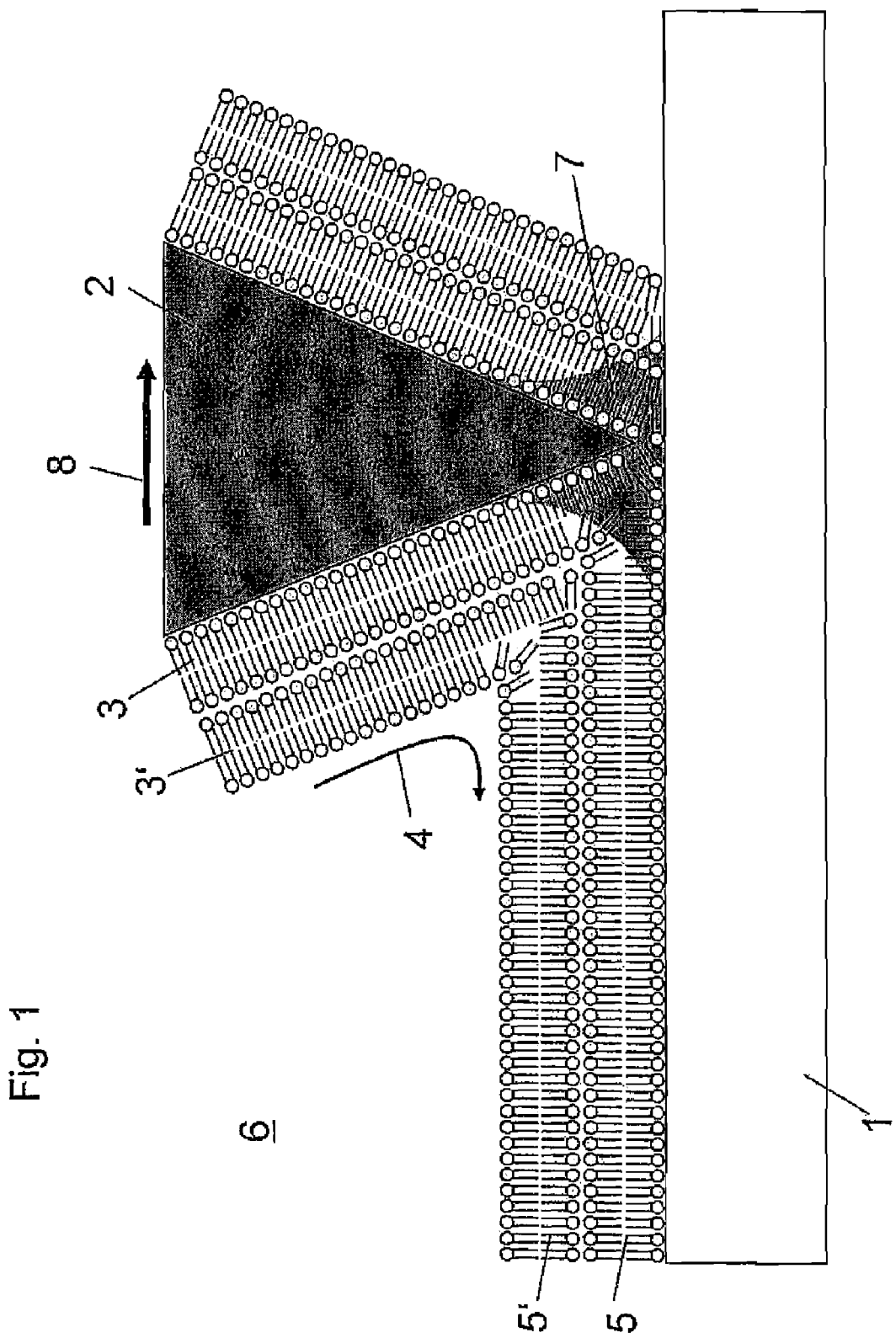
FIG. 1: a schematic, cross-sectional representation of an apparatus for carrying out an embodiment of a method according to the present invention.

In an embodiment, the present invention provides a method that will allow membrane lipids to be applied to a substrate, without the need for chemically pretreating the substrate.

In an embodiment, the present invention provides a method in which the membrane lipids are applied to the substrate without the need for chemically binding the same to the substrate itself or by way of other substances deposited thereon.

In an embodiment, the present invention provides a method that make it simple to control the number of lipid layers or lipid bilayers applied to the substrate.

To implement the method according to the present invention for applying a mono- or multilayer film of membrane lipids (lipid layers or bilayers), a substrate is first prepared in accordance with method step a).

A great variety of surfaces are suited as substrates, ranging preferably from hydrophilic silicon, to glass and metal, and including hydrophobic polymers, such as polystyrene, for example. The substrates are either untreated or, in one special embodiment, are subjected beforehand to a hydrophilic treatment using an oxygen plasma, or are treated lithographically in preferred regions.

Independently thereof, in accordance with method step b), membrane lipids are applied to the tip of a scanning probe microscope. To this end, the tip of the scanning probe microscope is dipped into an ink of membrane lipids in such a way that it is moistened by the same. During method step a), the ink reservoir is filled with a solution of a membrane lipid in a nonpolar solvent and, if indicated, a dye is added to the solution. The solution is allowed to stand until nearly complete vaporization of the solvent, before reversibly moistening the tip of the scanning probe microscope with the membrane lipids by dipping the same into the ink reservoir containing the membrane lipids. Due to the amphipathic properties of the membrane lipids, physisorption may be employed as a driving force for transporting the membrane lipids from the ink to the tip. The tip of the scanning probe microscope is able to be reproducibly moistened in this manner.

Subsequently thereto, in accordance with method step c), the tip of the scanning probe microscope is brought into contact with the surface of the substrate, the surface being directly contacted. Due to the atmospheric air humidity, which is preferably at least 40%, and especially at least 70%, a liquid meniscus forms between the tip and the surface of the substrate, thereby allowing the membrane lipids to begin to migrate from the tip to the surface. If, at this point, the tip of the scanning probe microscope is directed at a specific velocity over selected regions on the surface, the membrane lipids in these regions organize themselves at the surface in the form of a lipid layer or one or a plurality of mutually superposed lipid bilayers, in a liquid-crystalline phase.

In this contex, the membrane lipids are applied to the substrate in this way without being directly bonded to the substrate or indirectly chemically covalently bonded to the substrate by way of substances deposited on the substrate.

The present invention utilizes the three-dimensional self-organization of the membrane lipids, in particular of the phospholipids, as a driving force for the pattern formation.

This driving force is unique for lyotropic liquid-crystalline materials, preferably for phospholipids 1,2-dioleoyl-sn-glycero-3-phosphocholin (DOPC) at 20° C. and 1,2-dimyristoyl-sn-glycero-3-phosphocholin (DMPC) at 35° C., which may be partially provided with a fluorescent marker.

In an embodiment, the number of lipid (bi)layers on the surface is controlled by the velocity at which the tip of the scanning probe microscope moves over the surface of the substrate, and as a function of the value of the relative air humidity.

The phase characteristics of the phospholipids are sensitive to hydration which is controllable as a function of the relative air humidity. Thus, the rate at which the membrane lipids move from the tip of the scanning probe microscope to the surface of the substrate is adjustable as a function of the relative air humidity value. Therefore, the method according to the present invention makes it possible for the lipid (bi) layers to be formed three-dimensionally on the surface of the substrate as precisely as one single layer.

Finally, in accordance with method step d), the tip is removed from the surface of the substrate.

In accordance with the present invention, phospholipids are used as ink for the noncovalent patterning of different surfaces. In known methods heretofore, the lateral resolution of the structures obtained in this manner is 50 to 100 nm.

By controlling the viscosity of the ink composed of phospholipids, it is possible to store the ink exclusively on the tip of the scanning probe microscope and thereby avoid immersing the entire cantilever or the substrate in the solution and, at the same time, to reduce the risk of cross-contamination in comparison to methods carried out in solutions.

Since the present method also functions on dry surfaces, there is also no need for precautionary measures to prevent the tip of the scanning probe microscope or the substrate from drying out disadvantageously.

Since the patterning is not dependent on a layer of phospholipids already present on the substrate, the patterning process is carried out independently of the contact force between the tip of the scanning probe microscope and the substrate and, therefore, may be accomplished without any feedback control by the scanning probe microscope. In practice, this property is a prerequisite for simultaneous writing using several tips.

Simultaneous writing using different inks renders possible the precise arrangement and application of chemically different membrane lipid structures on a substrate.

FIG. 1 schematically shows the operating principle of the method according to the present invention. Dip pen nanolithography was carried out using a commercial DPN writer. To this end, the ink reservoir was filled with 1 μl of a 10 mM solution of a phospholipid in a nonpolar solvent, such as chloroform or dichloromethane. Moreover, in some of the trials, 1 mole percent of a dye was added to the solution.

As phospholipid were used, on the one hand, 1,2-dioleoyl-sn-glycero-3-phosphocholin (DOPC) or 1,2-dimyristoyl-sn-glycero-3-phosphocholin (DMPC) and, on the other hand, phospholipids 1,2-dioleoyl-sn-glycero-3-phosphoethanolamine-N-(lissamin rhodamine B sulfonyl) (18:1 lissamin rhodamine PE) or 1,2-dioleoyl-sn-glycero-3-phosphoethanolamine-N-(7-nitro-2-1,3-benzoxadiazol-4-yl) (18:1 NBD PE) provided with 1% fluorescent marker.

The solution was allowed to stand until nearly complete vaporization of the solvent, before tip 2 of the scanning probe microscope (AFM) was reversibly moistened with the phospholipids 3,3' by dipping the same into the ink reservoir containing the phospholipids. The relative air humidity was increased over a time period of at least 30 minutes to at least 50%, preferably to at least 60%, and especially to at least 90%, since the liquidity of the phospholipids does not suffice for immediately moistening the tip until high air humidity conditions prevail. At a relative air humidity below 50%, the ink no longer flowed out of the ink reservoir to tip 2.

Employing the method according to the present invention, structures 5,5' of DOPC were then deposited in writing direction 8 onto a substrate 1 of silicon, glass, a 100 nm thick titanium film, or the polymer polystyrene. Due to the air humidity of atmosphere 6, a liquid meniscus 7 formed between tip 2 of the scanning probe microscope and the surface of substrate 1, and was used for transfer 4 of the molecules from tip 2 to the surface.

While under known related art methods, inks that are bonded covalently to the substrate spread as a monolayer over the surface, phospholipids applied to substrate 1 in accordance with the present invention form one or more superposed layers 5,5', whose height is dependent upon the application speed of tip 2 in writing direction 8 and upon the relative air humidity of atmosphere 6.

Figure 2:
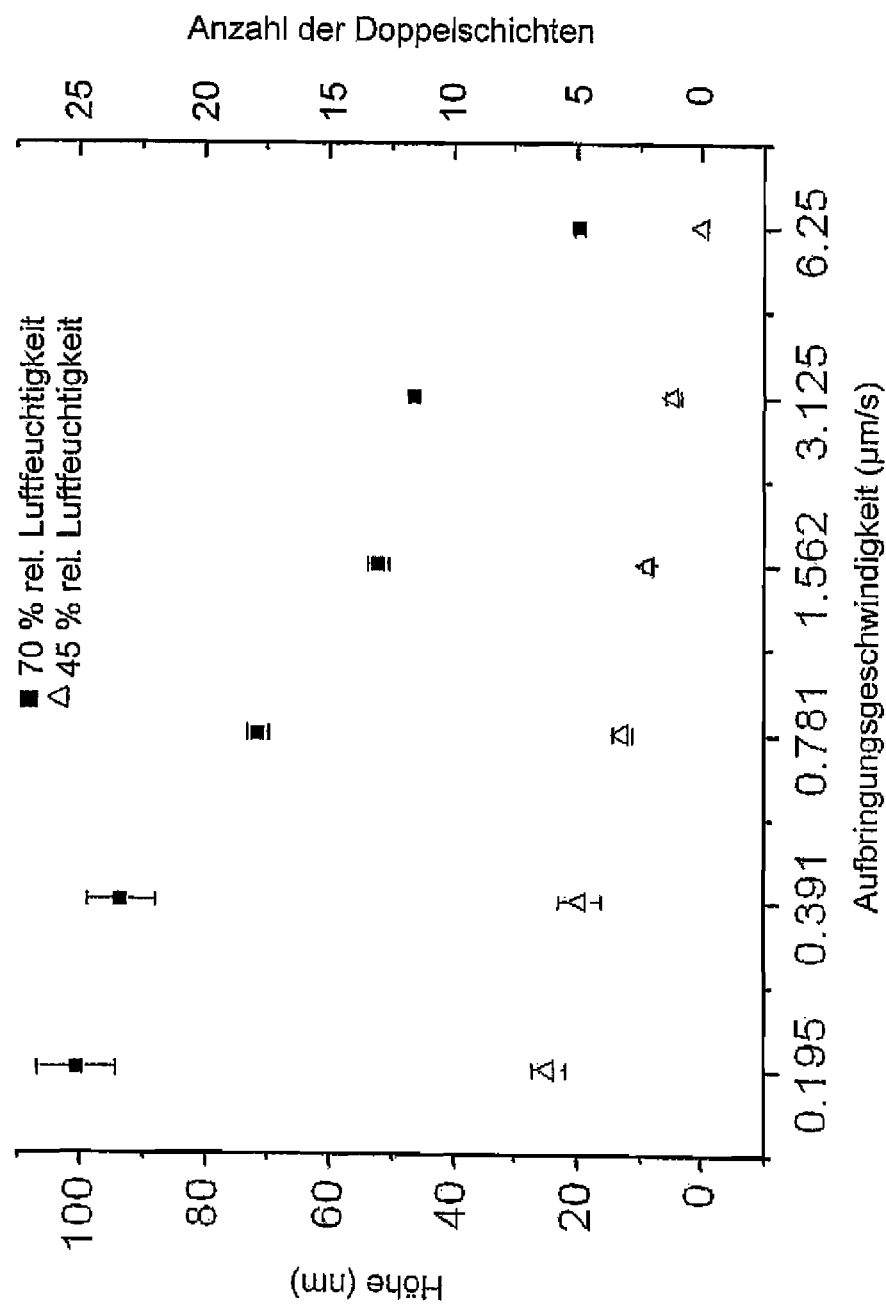
FIG. 2: a graph of the height of the phospholipid layers (left) and the number of lipid bilayers (right) as a function of the speed of application of the one phospholipid layer at 70% and, respectively, 45% relative air humidity.

On the left side, FIG. 2 shows the height of the phospholipid layers produced in accordance with the present invention and, on the right side, the corresponding number of lipid bilayers as a function of the speed of application of the layer in writing direction 8 for different values of the relative air humidity (70 and 45%). The height of layers 5,5' was determined using an AFM; the error bars indicate the standard deviation.

It may be inferred from FIG. 2 that the thickness of the phospholipid layers and thus the number of lipid bilayers is linearly dependent upon the speed of application of layer 5,5' in writing direction 8. This type of linear dependency may also be observed in the case of lateral diffusion, as occurs when working with covalent DPN. Here, however, another effect is provided which makes it possible to produce three-dimensional structures of phospholipids having a defined layer thickness.

The present invention has been described with reference to specific embodiments, but is not limited to those embodiments.

What is claimed is:

1. A method for applying membrane lipids to a substrate, comprising the steps of:
    a) providing a substrate and an ink reservoir having an ink including a membrane lipid;
    b) dipping a tip of a scanning probe microscope into the ink so as to dispose the membrane lipid on the tip;
    c) bringing the tip of the scanning probe microscope into contact with a surface of the substrate and moving the tip over regions of the surface so that the membrane lipid migrates from the tip of the scanning probe microscope onto the surface of the substrate so as to form a plurality of lipid multilayers in the regions, and controlling, in the plurality of lipid multilayers, the number of lipid layers substantially simultaneously stacked on the surface of the substrate by at least one of the velocity of the tip of the scanning probe microscope over the surface of the substrate and the relative air humidity in the atmosphere, wherein the relative air humidity is at least 50%; and then
    d) removing the tip from the surface of the substrate.

2. The method as recited in claim 1 wherein the substrate includes at least one of a silicon, a glass, a metal and a polymer material.

3. The method as recited in claim 2 further comprising preparing the ink by:
    providing a solution of the membrane lipid in a nonpolar solvent;
    allowing the solution to stand until the solvent is vaporized before performing step c).

4. The method as recited in claim 3 wherein the nonpolar solvent includes at least one of chloroform and dichloromethane.

5. The method as recited in claim 4 wherein the preparing the ink further comprises adding a dye to the solution of the membrane lipid in the nonpolar solvent.

6. The method as recited in claim 3 wherein the preparing the ink further comprises adding a dye to the solution of the membrane lipid in the nonpolar solvent.

7. The method as recited in claim 1 further comprising preparing the ink by:
    providing a solution of the membrane lipid in a nonpolar solvent;
    allowing the solution to stand until the solvent is vaporized before performing step b).

8. The method as recited in claim 7 wherein the nonpolar solvent includes at least one of chloroform and dichloromethane.

9. The method as recited in claim 8 wherein the preparing the ink further comprises adding a dye to the solution of the membrane lipid in the nonpolar solvent.

10. The method as recited in claim 7 wherein the preparing the ink further comprises adding a dye to the solution of the membrane lipid in the nonpolar solvent.

11. The method as recited in claim 1 wherein the membrane lipid includes a phospholipid.

12. The method as recited in claim 11 wherein the phospholipid includes 1,2-dioleoyl-sn-glycero-3-phosphocholin (DOPC) or 1,2-dimyristoyl-sn-glycero-3-phosphocholin (DMPC).

13. The method as recited in claim 1 further comprising providing the membrane lipid with a fluorescent marker.

* * * * *